(12) United States Patent
Kurose et al.

(10) Patent No.: US 8,058,878 B2
(45) Date of Patent: Nov. 15, 2011

(54) BATTERY INFORMATION ACQUIRING APPARATUS

(75) Inventors: Daisuke Kurose, Kawasaki (JP); Hiroki Sakurai, Tokyo (JP); Tetsuro Itakura, Tokyo (JP); Yoshinao Tatebayashi, Yokohama (JP); Nobuo Shibuya, Hiratsuka (JP); Toshiyuki Umeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 462 days.

(21) Appl. No.: 12/406,534

(22) Filed: Mar. 18, 2009

(65) Prior Publication Data

US 2010/0079146 A1 Apr. 1, 2010

(30) Foreign Application Priority Data

Sep. 26, 2008 (JP) ................................. 2008-248691

(51) Int. Cl.
*G01N 27/416* (2006.01)
*H02J 7/04* (2006.01)
*G01R 31/36* (2006.01)

(52) U.S. Cl. ........................... 324/433; 320/152; 702/63
(58) Field of Classification Search ................... 324/433
See application file for complete search history.

(56) References Cited

U.S. PATENT DOCUMENTS

2008/0045792 A1* 2/2008 Shimizu et al. .............. 600/118
2008/0091364 A1* 4/2008 Lim et al. ....................... 702/63
2009/0174410 A1* 7/2009 Kim et al. ..................... 324/426

FOREIGN PATENT DOCUMENTS

| JP | 11-345622 | 12/1999 |
| JP | 3775587 | 3/2006 |

* cited by examiner

Primary Examiner — Edward Tso
Assistant Examiner — M'Baye Diao
(74) Attorney, Agent, or Firm — Oblon, Spivak, McClelland, Maier & Neustadt, L.L.P.

(57) ABSTRACT

There is an apparatus includes a voltage acquiring unit which acquires an inter-terminal voltage of the battery cell; a battery information acquiring circuit which acquires battery information of the battery cell with the acquired voltage being supplied as a power supply voltage and; a transformer configured to have a primary winding and a secondary winding, the primary winding being connected to a common wire; a communication circuit which transmits a signal of the battery information to a management unit, supplied with the acquired voltage as a power supply voltage; a rectification circuit which rectifies a signal of a predetermined frequency from the management unit to generate a DC voltage; and a control circuit which controls the supply of the power supply voltages to the battery information acquiring circuit and the communication circuit, the control circuit being supplied with the DC voltage as a power supply voltage.

16 Claims, 13 Drawing Sheets

BATTERY INFORMATION ACQUIRING APPARATUS

CROSS REFERENCE TO RELATED APPLICATIONS

This application is based upon and claims the benefit of priority from the prior Japanese Patent Applications No. 2008-248691, filed on Sep. 26, 2008; the entire contents of which are incorporated herein by reference.

BACKGROUND OF THE INVENTION

1. Field of the Invention

The present invention relates to a battery information acquiring apparatus that acquires battery information of a battery cell in a battery pack including a plurality of the battery cells connected in series and transmits the battery information to a management unit that manages the battery pack.

2. Related Art

As supply of battery power for electric cars or industrial vehicles, battery packs in which many battery cells of low voltage and low capacity are connected in series or in parallel are used to obtain a high voltage and high capacity voltage. Safe operation of a battery pack requires a battery information management system that monitors battery information such as a voltage and temperature of each battery cell.

A conventional battery information management system has a plurality of battery information acquiring modules each including a battery cell, battery information acquiring circuit and transmitting/receiving circuit (communication circuit) and carries out communication and control between the management unit and each battery information acquiring module (see JP-A 11-345622 (Kokai)).

Each battery information acquiring module receives a supply of power and GND from the respective battery cells all the time, and therefore there is a problem that power is consumed even during standby during which control signals and battery information are not communicated with the management unit.

Furthermore, the respective battery information acquiring modules transmit battery information acquired from their respective battery cells to the management unit using differential signals, and in this case, differential signals transmitted from the respective battery information acquiring modules have different common mode voltages. For this reason, it is necessary to connect two wires from each battery information acquiring module to the management unit respectively and carry out transmission through the respective wires. This results in a problem of making wiring more complicated.

Furthermore, the management unit side also has a problem that it is necessary to have a function of shifting the levels of signals of common mode voltages that vary from one battery information acquiring module to another and secure their withstand voltages.

SUMMARY OF THE INVENTION

According to an aspect of the present invention, there is provided with a battery information acquiring apparatus that acquires battery information of a battery cell in a battery pack including a plurality of battery cells connected in series and transmits the battery information to a management unit that manages a state of the battery pack, comprising:

a voltage acquiring unit configured to acquire an inter-terminal voltage of the battery cell;

a battery information acquiring circuit configured to acquire battery information of the battery cell, the battery information acquiring unit being supplied with the voltage acquired by the voltage acquiring unit as a first power supply voltage and;

a transformer configured to have a primary winding and a secondary winding, the primary winding being connected to a common wire to which the management unit and other battery information acquiring apparatuses that acquire battery information of different battery cells out of the battery cells are commonly connected;

a communication circuit connected to the secondary winding of the transformer, which transmits a signal of the battery information to the management unit via the transformer and the common wire, the communication circuit being supplied with the voltage acquired by the voltage acquiring unit as a second power supply voltage;

a rectification circuit connected to the secondary winding of the transformer, which receives a signal of a predetermined frequency transmitted from the management unit via the transformer, and rectifies the signal of the predetermined frequency to generate a DC voltage; and a control circuit connected to the secondary winding of the transformer, which controls the supply of the first and second power supply voltages to the battery information acquiring circuit and the communication circuit, the control circuit being supplied with the DC voltage generated by the rectification circuit as a third power supply voltage, wherein the control circuit comprises:

a first receiving unit configured to receive a first command signal indicating whether or not to supply the first power supply voltage to the battery information acquiring circuit from the management unit via the common wire and the transformer;

a second receiving unit configured to receive a second command signal indicating whether or not to supply the second power supply voltage to the communication circuit from the management unit via the common wire and the transformer;

a first controller configured to control supply of the first power supply voltage to the battery information acquiring circuit according to the first command signal; and a second controller configured to control supply of the second power supply voltage to the communication circuit according to the second command signal.

DETAILED DESCRIPTION OF THE INVENTION

With reference now to the attached drawings, embodiments of the present invention will be explained in detail below.

Figure 1:
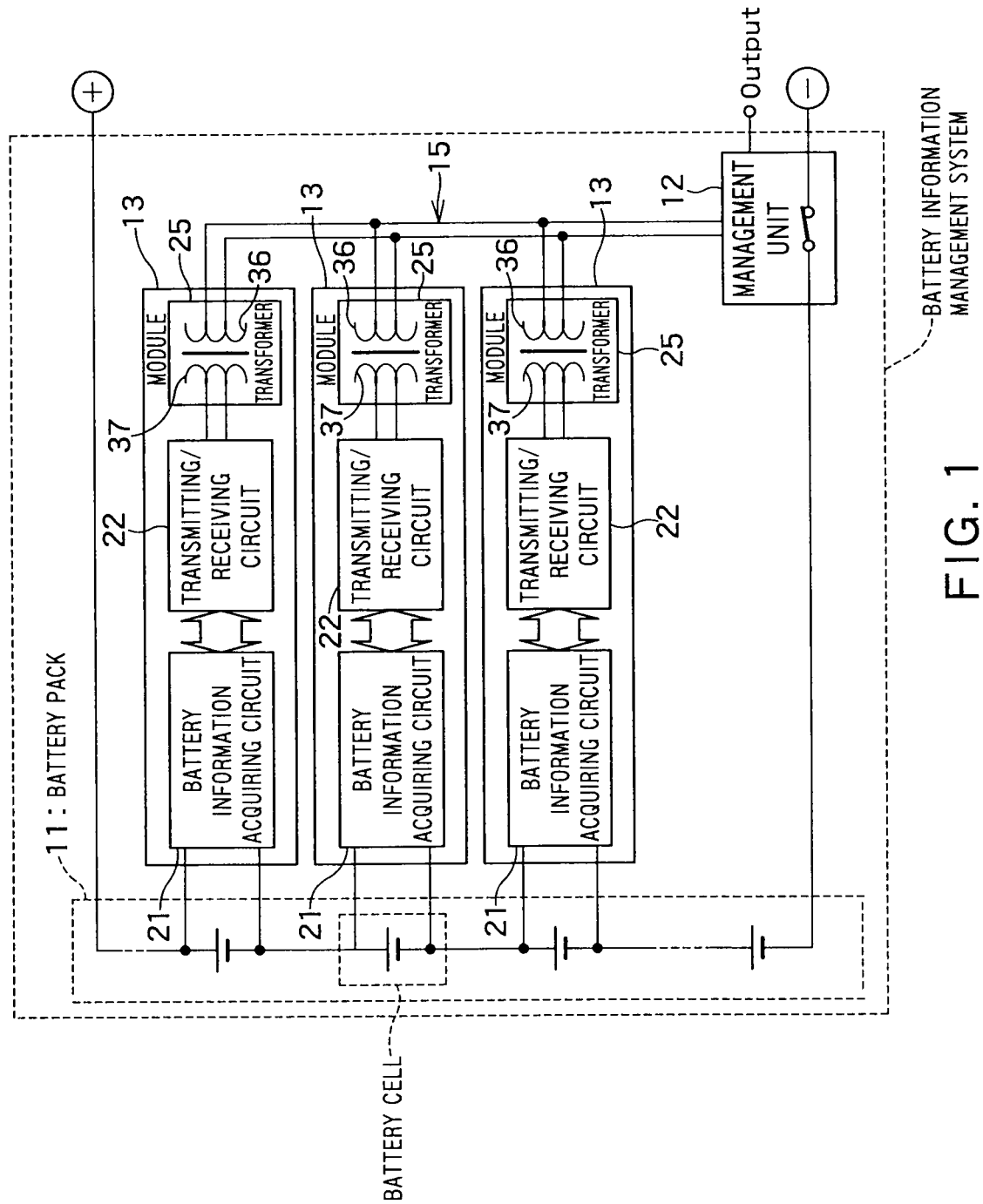
FIG. 1 schematically shows a configuration of a battery information management system according to an embodiment of the present invention.

FIG. 1 is a block diagram schematically showing a configuration of a battery information management system according to an embodiment of the present invention. This battery information management system can be incorporated in a system or apparatus such as vehicle system or power-assisted bicycle that operates using a battery pack.

The battery information management system in FIG. 1 is provided with a battery pack 11 made up of a plurality of battery cells connected in series, a management unit 12 that manages the state of the battery pack and a plurality of battery information acquiring modules (battery information acquiring apparatuses) 13 that acquire battery information from the battery cell of the battery pack 11 and transmit the battery information to the management unit. The respective battery information acquiring modules 13 are connected to different battery cells.

The battery pack 11 is made up of a plurality of battery cells connected in series. Connecting a plurality of battery cells in series in this way makes it possible to obtain a voltage higher than the voltage of one battery cell. To obtain a still greater battery capacity, a plurality of such battery packs 11 may be provided and connected in parallel.

Each battery information acquiring module 13 detects battery information such as an inter-terminal voltage (a voltage between plus terminal and minus terminal) of each battery cell of the battery pack 11 or a temperature of each battery cell and transmits the detected battery information to the management unit 12 via a common wire 15 commonly connected to the respective battery information acquiring modules 13. More specifically, a battery information acquiring circuit 21 acquires battery information and a transmitting/receiving circuit (communication circuit) 22 transmits the battery information to the management unit 12 via a transformer 25.

A primary winding 36 of each transformer 25 is connected to the above-described common wire and a secondary winding 37 is connected to the transmitting/receiving circuit (communication circuit) 22 or the like. FIG. 1 shows only the battery information acquiring circuit 21, transmitting/receiving circuit 22 and transformer 25 as the components of the battery information acquiring module 13, but other components are actually included as shown in FIG. 2, which will be described later.

Providing each battery information acquiring module 13 with the transformer 25 allows each battery information acquiring module 13 to be connected to the management unit 12 in parallel with the common wire and can thereby prevent complexity of wiring. That is, wiring need not be provided for every battery information acquiring module 13 and each battery information acquiring module 13 needs only to be provided with a common wire. Furthermore, carrying out communication via the common wire reduces the voltages of communication signals handled by the management unit 12 and eliminates the necessity for the management unit 12 side to provide a high withstand voltage parts.

The management unit 12 acquires battery information from the battery information acquiring module 13 corresponding to each battery cell via the common wire 15 and manages the battery pack based on the acquired battery information so that the battery pack operates safely. The management unit 12 has the function of outputting the acquired battery information to outside.

Figure 2:
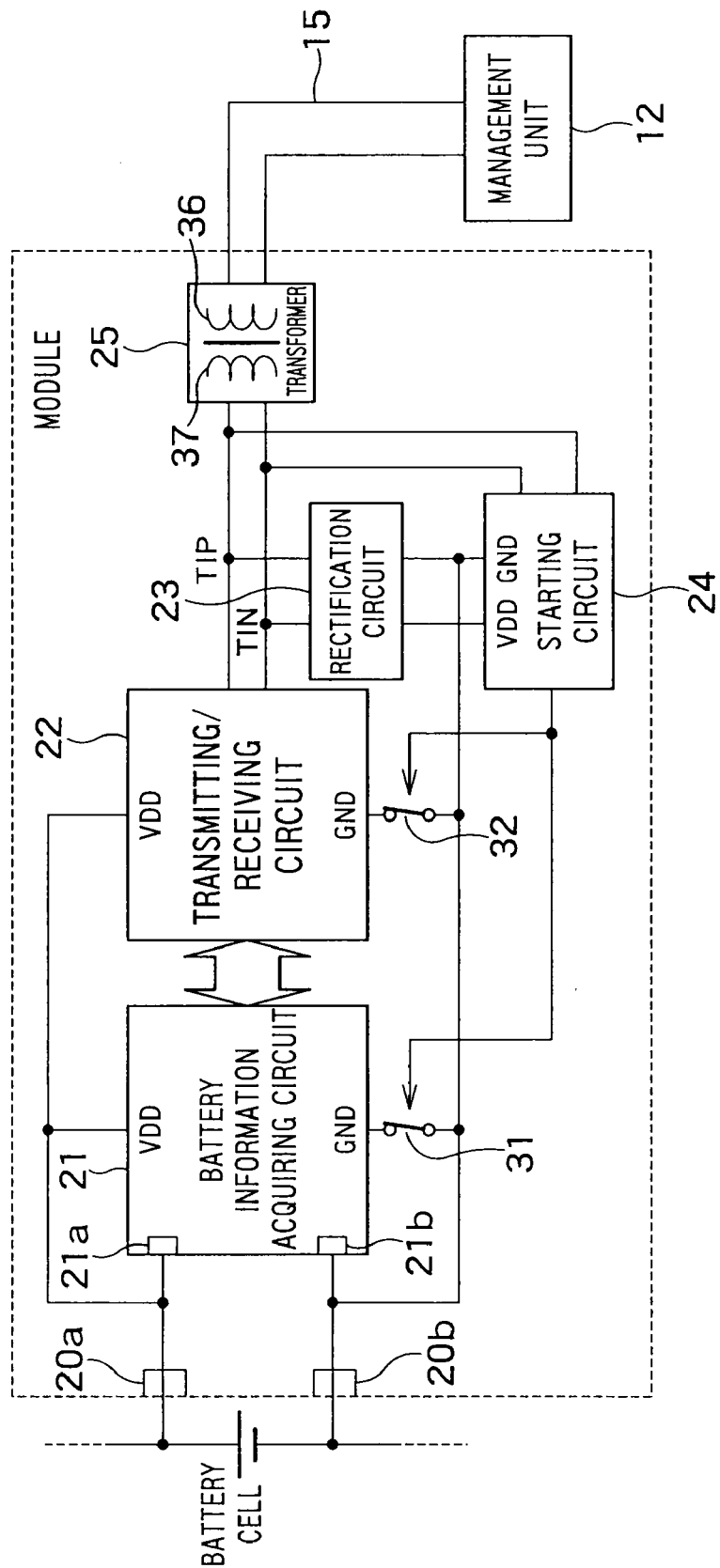
FIG. 2 shows a detailed configuration of the battery information acquiring module.

FIG. 2 shows a detailed configuration example of the battery information acquiring module 13.

The battery information acquiring module 13 is provided with voltage acquiring units 20a and 20b, the battery information acquiring circuit 21, the transmitting/receiving circuit (communication circuit) 22, a rectification circuit 23, a starting circuit 24 and the transformer 25.

The transformer 25 has the primary winding 36 and the secondary winding 37. The primary winding is connected to the management unit 12 via the common wire 15.

The voltage acquiring units 20a and 20b are connected to a plus terminal and a minus terminal of the battery cell via their respective wires. This allows the voltage acquiring units to acquire an inter-terminal voltage of the battery cell. The acquired voltage is used as a power supply voltage (operation voltage) of the battery information acquiring circuit 21 and the transmitting/receiving circuit 22. Furthermore, the acquired voltage is acquired by the battery information acquiring circuit 21 via input terminals 21a and 21b as battery information.

The battery information acquiring circuit 21 has a VDD terminal and a GND terminal, and the VDD terminal is connected to the plus terminal of the battery cell via the voltage acquiring unit 20a and the GND terminal is connected to the minus terminal of the battery cell via a switch unit 31 and the voltage acquiring unit 20b. The battery information acquiring circuit 21 is given the voltage of the battery cell between the VDD terminal and GND terminal as a first power supply voltage when the switch unit 31 is ON and operates on this first power supply voltage (power of the battery information acquiring circuit 21 turns ON). Furthermore, the battery information acquiring circuit 21 also has the input terminal (voltage input unit) 21a which is connected to the plus terminal of the battery cell via the voltage acquiring unit 20a and the input terminal (voltage input unit) 21b connected to the minus terminal of the battery cell via the voltage acquiring unit 20b, and the battery information acquiring circuit 21 acquires the voltage inputted between the input terminals 21a and 21b as battery information. Furthermore, the battery information acquiring circuit 21 acquires the temperature of the battery cell using a temperature sensor (see FIG. 6) which will be described later as battery information. The battery information is acquired when a transmission command from the transmitting/receiving circuit 22 is inputted and the battery information acquiring circuit 21 outputs the acquired battery information to the transmitting/receiving circuit 22.

The transmitting/receiving circuit 22 has a VDD terminal and a GND terminal, and the VDD terminal is connected to the plus terminal of the battery cell via the voltage acquiring unit 20a and the GND terminal is connected to the minus terminal of the battery cell via a switch unit 32 and the voltage acquiring unit 20b. Furthermore, the transmitting/receiving circuit 22 is also connected to the secondary winding 37 of the transformer 25. When the switch unit 32 is ON, the transmitting/receiving circuit 22 is given the voltage of the battery cell between the VDD terminal and GND terminal as a second power supply voltage and operates on this second power supply voltage (power of the transmitting/receiving circuit 22 turns ON). In an ON-state, the transmitting/receiving circuit 22 detects a transmission command signal transmitted through AC from the management unit 12 via the transformer 25 and outputs the detected transmission command to the battery information acquiring circuit 21. The transmitting/receiving circuit 22 acquires the battery information inputted from the battery information acquiring circuit 21 in response to the transmission command and modulates the signal of the acquired battery information and transmits the signal to the management unit 12 via the transformer 25. Here, the transmitting/receiving circuit 22 is given a unique ID (identifier) and this allows the transmitting/receiving circuit 22 to be individually identified from transmitting/receiving circuits of battery information acquiring modules connected to other battery cells. When battery information is transmitted, the ID is also transmitted and this allows the management unit 12 to recognize the battery cell from which the received battery information derives. The management unit 12 monitors the state of each battery cell based on the acquired battery information and can output the state of each battery cell to outside.

The rectification circuit 23 is connected to the secondary winding 37 of the transformer 25, receives the AC signal transmitted from the management unit 12 via the transformer 25, rectifies the received AC signal to generate a DC voltage. The rectification circuit 23 has a GND terminal and a VDD terminal, and gives the DC voltage generated to the starting circuit 24 via these terminals.

The starting circuit 24 has a GND terminal and a VDD terminal and is given the DC voltage from the rectification circuit 23 via these terminals as a third power supply voltage. When given the DC voltage (third power supply voltage), the starting circuit 24 is activated. The starting circuit 24 is connected to the secondary winding 37 of the transformer 25. Upon receiving a starting signal through AC from the management unit 12 via the transformer 25, the activated starting circuit 24 gives power control signals for turning ON the switch units 31 and 32 to the respective switch units 31 and 32 and thereby turns ON the switch units 31 and 32. That is, the starting circuit 24 turns ON the power of the battery information acquiring circuit 21 and the transmitting/receiving circuit 22. Upon receiving an end signal transmitted through AC from the management unit 12 via the transformer 25, the starting circuit 24 gives power control signals for turning OFF the switch units 31 and 32 to the respective switch units 31 and 32 and thereby turns OFF the switch units 31 and 32. That is, the starting circuit 24 turns OFF the power of the battery information acquiring circuit 21 and the transmitting/receiving circuit 22.

An example has been shown here where both of the switch units 31 and 32 are turned ON and OFF simultaneously, but the switch units 31 and 32 may also be controlled so as to be turned ON and OFF separately. That is, when a first starting signal (first command signal) is received from the management unit 12, the switch unit 31 may be turned ON and when a second starting signal (second command signal) is received, the switch unit 32 may be turned ON, and when a first end signal (first command signal) is received, the switch unit 31 may be turned OFF and when a second end signal (second command signal) is received, the switch unit 32 may be turned OFF.

The starting circuit 24 includes a first receiving unit that receives a first command signal, a second receiving unit that receives a second command signal, a first controller that controls ON/OFF of the switch unit 31 (that is, whether or not to supply a power supply voltage to the battery information acquiring circuit) according to the first command signal and a second controller that controls ON/OFF of the switch unit 32 (that is, whether or not to supply a power supply voltage to the transmitting/receiving circuit) according to the second command signal.

The AC signal received via the transformer 25 may include a transmission command signal or a starting signal or may include neither of those signals, but the received AC signal is inputted to all of the transmitting/receiving circuit 22, rectification circuit 23 and starting circuit 24 in any case. The transmitting/receiving circuit 22 detects the transmission command signal from the AC signal and the starting circuit 24 detects the starting signal from the AC signal. The rectification circuit 23 rectifies the received AC signal to generate a DC voltage regardless of the type of the signal included.

An example of operations in the above-described configuration will be explained below.

First, both the switches 31 and 32 are set to OFF and therefore the power of the battery information acquiring circuit 21 and transmitting/receiving circuit 22 is OFF. A procedure for acquiring and transmitting battery information in this state will be shown below.

First, an AC signal of a predetermined frequency is transmitted from the management unit 12 and the transmitted AC signal is inputted to the rectification circuit 23 via the transformer 25 and converted to a DC voltage. This DC voltage is inputted to the starting circuit 24 as a power supply voltage thereof. This allows the starting circuit 24 to operate.

Next, a starting signal included in the AC signal is transmitted from the management unit 12 and received by the starting circuit 24 via the transformer 25. The starting circuit 24 detects this starting signal. The starting circuit 24 having detected the starting signal generates a power supply control signal for turning ON the switches 31 and 32 and transmits the power supply control signal to the switches 31 and 32. This causes the switches 31 and 32 to turn ON and causes the power of the battery information acquiring circuit 21 and the transmitting/receiving circuit 22 to turn ON.

Next, a transmission command signal is included in the AC signal and transmitted from the management unit 12 and received by the transmitting/receiving circuit 22 via the transformer 25. The transmitting/receiving circuit 22 detects this transmission command signal, converts this transmission command signal to an instruction (transmission command) for operating the battery information acquiring circuit 21 and transmits the instruction to the battery information acquiring circuit 21.

Upon receiving this transmission command, the battery information acquiring circuit 21 acquires the battery information and sends the acquired battery information to the transmitting/receiving circuit 22. The transmitting/receiving circuit 22 modulates the received battery information and transmits the battery information to the management unit 12 via the transformer 25.

The management unit 12 having acquired the battery information includes an end signal in the AC signal and transmits the AC signal. This end signal is received and detected by the starting circuit 24 via the transformer 25. Upon detecting the end signal, the starting circuit 24 generates power control signals for turning OFF the switches 31 and 32 and transmits the power control signals to the switches 31 and 32. This causes the switches 31 and 32 to turn OFF and causes the power of the battery information acquiring circuit 21 and the transmitting/receiving circuit 22 to turn OFF.

During the above-described operation, suppose the rectification circuit 23 is always receiving an AC signal from the management unit 12 as input and performing rectification operation.

As described above, by rectifying an AC signal received via the transformer 25 to generate a DC voltage and driving the starting circuit (control circuit) that controls ON/OFF of power of the battery information acquiring circuit 21 and the transmitting/receiving circuit 22 using the DC voltage generated, it is possible to reduce power consumed from the battery cell during standby during which the battery information acquiring circuit 21 and transmitting/receiving circuit 22 do not operate.

Figure 3:
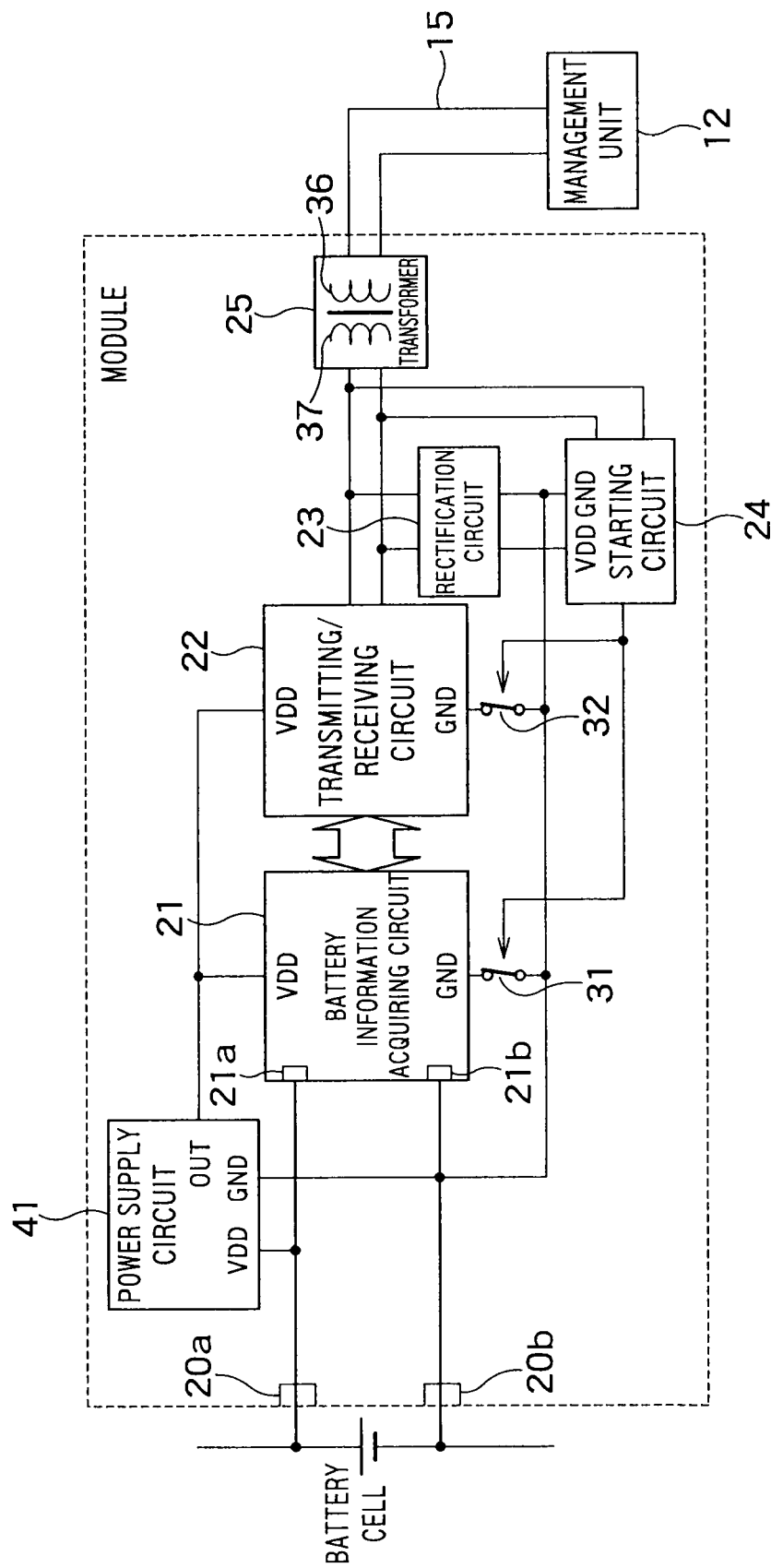
FIG. 3 shows a configuration with a power supply circuit for DC-DC conversion added to the battery information acquiring module in FIG. 2.

In the configuration shown in FIG. 2, the battery information acquiring circuit 21 and the transmitting/receiving circuit 22 directly use the voltage of the battery cell as the power supply voltage, but the voltage of the battery cell may also be DC-DC converted and the DC-DC converted voltage (voltage lower or higher than the voltage of the battery cell) may also be used as the power supply voltage. For this purpose, a power supply circuit 41 for DC-DC converting the voltage of the battery cell may be provided as shown in FIG. 3, the voltage of the battery cell may be DC-DC converted by the power supply circuit 41 and the converted voltage may be given to the battery information acquiring circuit 21 and the transmitting/receiving circuit 22. Alternatively, both the voltage of the battery cell and the DC-DC converted voltage may be used and one may be given to the battery information acquiring circuit 21 and the other to the transmitting/receiving circuit 22.

Figure 4:
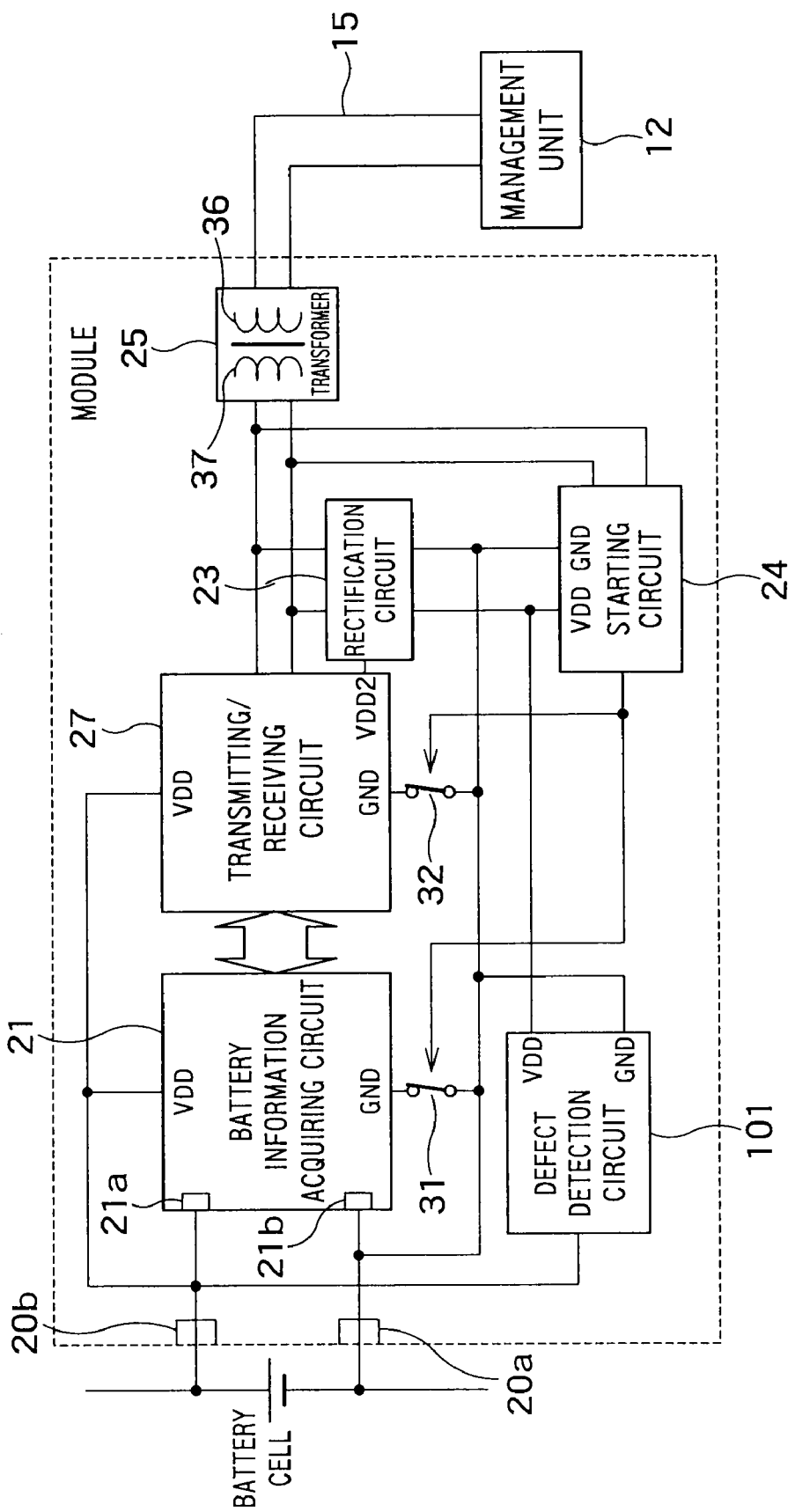
FIG. 4 shows a configuration in which a defect detection circuit is added to the battery information acquiring module in FIG. 2 and further the rectification circuit is enabled to supply a DC voltage to the transmitting/receiving circuit.

Here, when a defect occurs in the battery cell or the like in the configuration of FIG. 2, it is also possible to provide a defect detection circuit 101 that detects the occurrence of the defect and reports a defect signal to the management unit 12 as shown in FIG. 4. However, when a defect occurs in the battery cell or the like, the power supply voltage from the battery cell is not supplied and the transmitting/receiving circuit 22 cannot transmit the defect signal. Therefore, as shown in FIG. 4, the rectification circuit 23 may be enabled to supply a DC voltage to a transmitting/receiving circuit 27 so that in the event of occurrence of a defect of the battery cell or the like, the transmitting/receiving circuit 27 operates on the DC voltage rectified by the rectification circuit 23.

That is, in FIG. 4, a VDD terminal 2 is added to the transmitting/receiving circuit 27 and the added VDD terminal 2 is connected to the VDD terminal of the rectification circuit 23, and when the switch unit 32 is turned ON in this condition, a power supply voltage (fourth power supply voltage) is thereby supplied from the rectification circuit 23 to the transmitting/receiving circuit 27 and the transmitting/receiving circuit 27 can thereby operate even when the power supply voltage from the power supply cell is not supplied (i.e. the supply of the power supply voltage is stopped). The transmitting/receiving circuit 27 includes a second voltage acquiring unit that acquires the power supply voltage (fourth power supply voltage) from the rectification circuit 23. Upon detecting a defect of the battery cell or the like, the defect detection circuit 101 sends a defect signal to the transmitting/receiving circuit 27 and the transmitting/receiving circuit 27 transmits the defect signal to the management unit 12 via the transformer 25. The management unit 12 may analyze contents of the received defect signal and output the analysis result to outside.

The defect detection circuit 101 has three major defect detection functions of detecting as defects of the battery cell or the like, a drop of the inter-terminal voltage of the battery cell below a predetermined voltage, disconnection of the connection wire connecting the battery cell and the battery information acquiring circuit 21 and short-circuit of the inter-terminal (short-circuit between plus and minus terminals) of the battery cell. The details of these defect detection functions of the defect detection circuit 101 will be described later.

Figure 5:
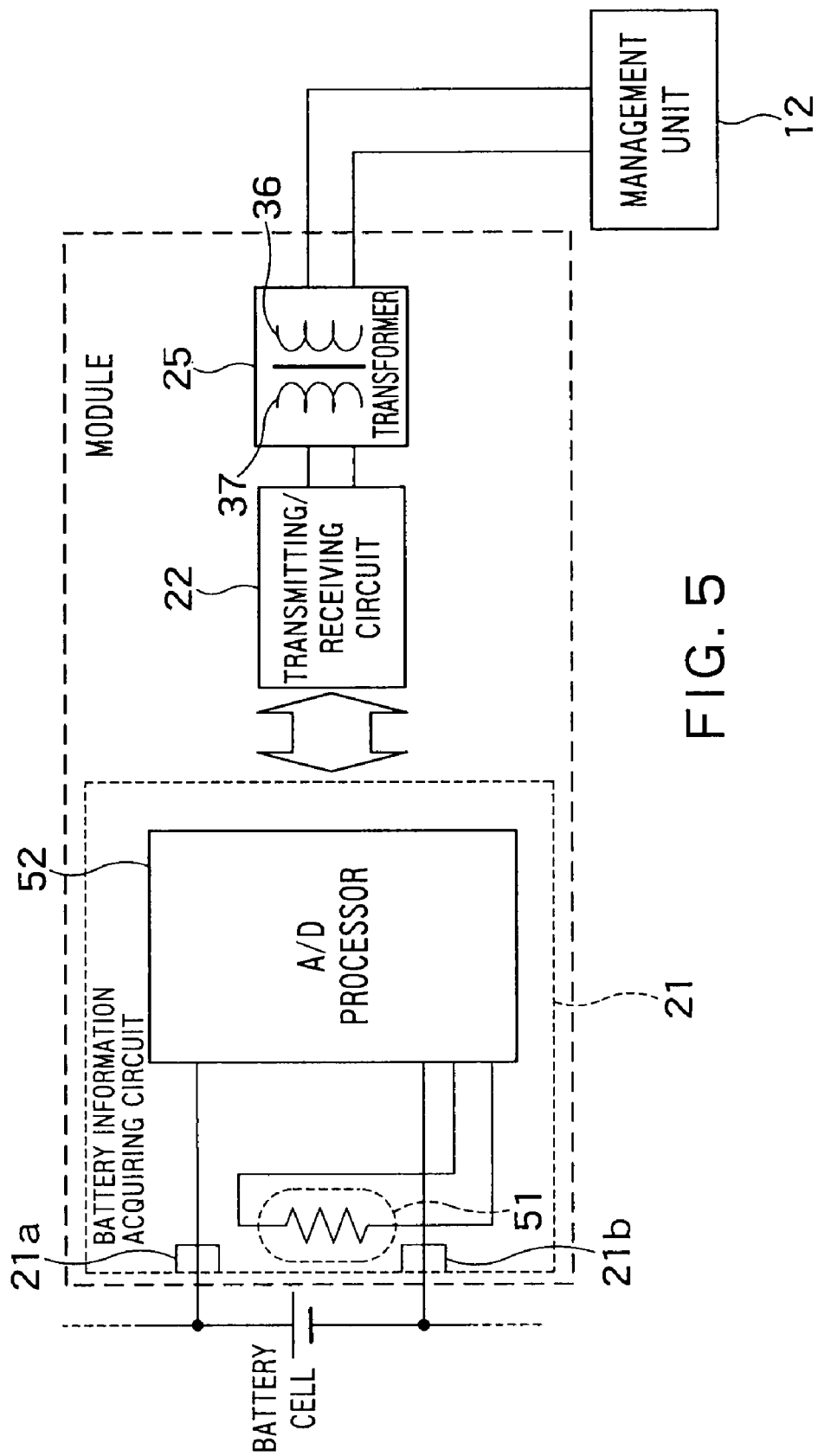
FIG. 5 shows a configuration example of the battery information acquiring circuit in the battery information acquiring module in FIG. 2.

FIG. 5 shows an example of the detailed configuration of the battery information acquiring circuit 21.

As described above, the battery information acquiring circuit 21 is connected to both ends of the battery cell via the input terminals 21a and 21b and acquires the inter-terminal voltage of the battery cell. Furthermore, the battery information acquiring circuit 21 is provided with a temperature sensor 51 such as thermistor and detects the temperature of the battery cell through the temperature sensor 51.

An A/D processor 52 converts a voltage acquired through the input terminals 21a and 21b to a digital signal. The A/D processor 52 sends the digital signal generated to the transmitting/receiving circuit 22 and the transmitting/receiving circuit 22 transmits the digital signal to the management unit 12 via the transformer 25.

Figure 6:
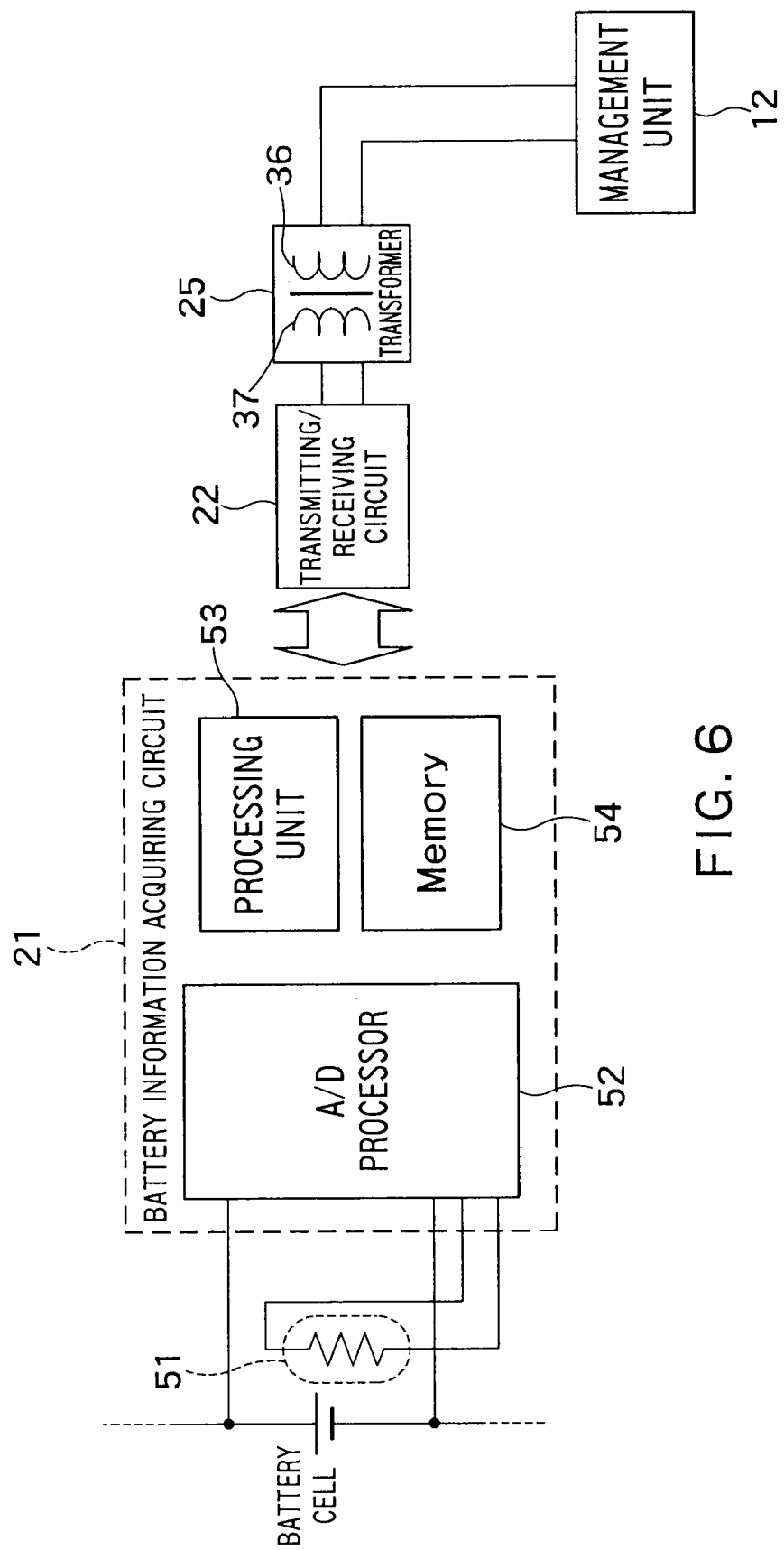
FIG. 6 shows another configuration example of the battery information acquiring circuit in the battery information acquiring module in FIG. 2.

Here, as shown in FIG. 6, the battery information acquiring circuit 21 may further be configured to include a processing unit 53 and a memory 54. The processing unit 53 controls the entire battery information acquiring circuit 21 and especially controls the acquisition of the battery information. The memory 54 saves the acquired battery information. More specifically, the processing unit 53 performs such control as to transmit/receive data to/from the transmitting/receiving circuit 22 and acquire, upon receiving a transmission command instruction from the management unit 12 via the transmitting/receiving circuit 22, the battery information of the battery cell and send the battery information to the transmitting/receiving circuit 22. In this control, the A/D processor 52 first acquires the inter-terminal voltage of the battery cell and the detected voltage of the temperature sensor and converts these acquired voltages to digital signals. Next, the processing unit 53 performs digital processing on these digital signals using digital processing logic, converts the digital signals to a data format suitable for the management unit 12 and saves the data in this data format in the memory 54. Next, the processing unit 53 sends the data saved in the memory 54 to the transmitting/receiving circuit 22, and the transmitting/receiving circuit 22 transmits this data to the management unit 12 via the transformer 25. The digital signal may also be transmitted to the management unit 12 without being converted to the above-described data format.

As shown in FIG. 1, an example has been explained so far where one battery information acquiring module is connected for each battery cell. That is, a battery information acquiring module is connected to each of the plurality of battery cells connected in series (e.g., N battery cells), one battery information acquiring module acquires battery information of one battery cell and transmits the battery information to the management unit 12. On the other hand, it is also possible to adopt a configuration in which one battery information acquiring module is connected to each group of a plurality of battery cells, and the one battery information acquiring module acquires battery information of each battery cell included in the group and transmits the battery information to the management unit 12.

Figure 7:
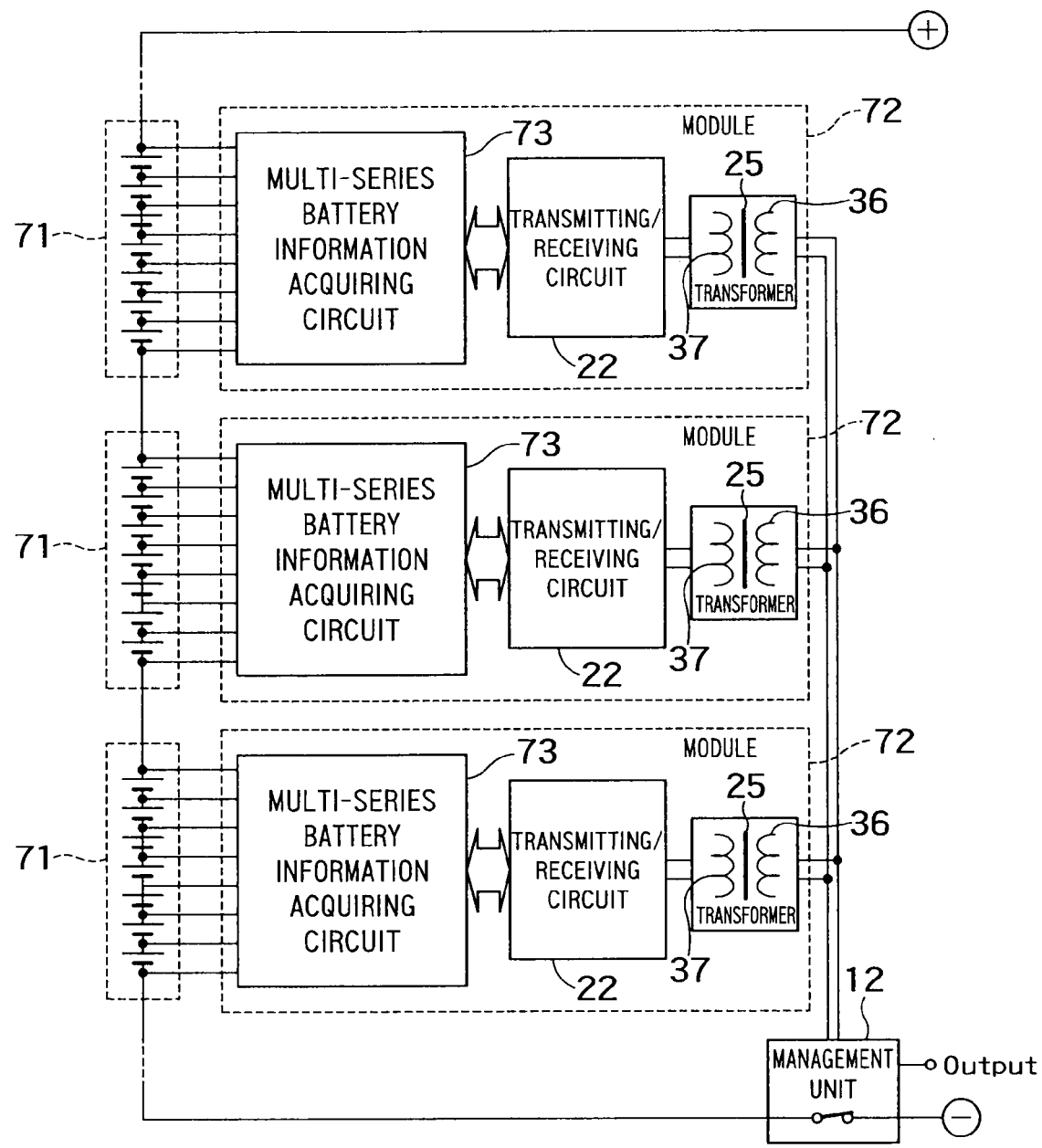
FIG. 7 shows a configuration example where a battery information acquiring module is connected to each group of a plurality of battery cells.

FIG. 7 shows a configuration example where one battery information acquiring module is connected for each group of a plurality of battery cells in this way.

The plurality (N) of serially connected battery cells are divided into a plurality of groups 71 each made up of M (M<N) battery cells and one battery information acquiring module 72 is connected for each group 71. The number of battery cells in each group may be the same or different. The battery information acquiring module 72 acquires battery information from each battery cell included in the corresponding group 71 and transmits the battery information to the management unit 12.

The battery information acquiring module 72 is provided with a multi-series battery information acquiring circuit 73, a transmitting/receiving circuit 22, a transformer 25, a rectification circuit, a starting circuit, a switch unit or the like. However, the rectification circuit, starting circuit and switch unit are omitted for simplicity of notation. The transmitting/receiving circuit 22, transformer 25, rectification circuit, starting circuit and switch unit have functions equivalent to those of the elements of the same names in FIG. 2 and the multi-series battery information acquiring circuit 73 has functions equivalent to those of the battery information acquiring circuit 21 in FIG. 2 except in that battery information is acquired from the plurality of battery cells respectively. The configuration shown in FIG. 3 or FIG. 4 may also be adopted for the battery information acquiring module in FIG. 7.

When a comparison is made between the configuration in FIG. 7 and the configuration in FIG. 1, a voltage corresponding to one battery cell is applied to the battery information acquiring circuit 21 in the configuration in FIG. 1, and therefore there is an advantage that high withstand voltage parts or circuits are not necessary. On the other hand, in the configuration in FIG. 7, a voltage applied to the battery information acquiring circuit 73 and transmitting/receiving circuit 22 corresponds to M battery cells, and therefore although the voltage applied to the battery information acquiring circuit 73 and transmitting/receiving circuit 22 increases, there is an advantage that the number of parts such as the battery information acquiring circuit, transmitting/receiving circuit and transformer can be reduced. Therefore, depending on the operating conditions and operating situations of the battery information acquiring module, one of the configurations, whichever is more suitable, may be adopted as appropriate.

Figure 8:
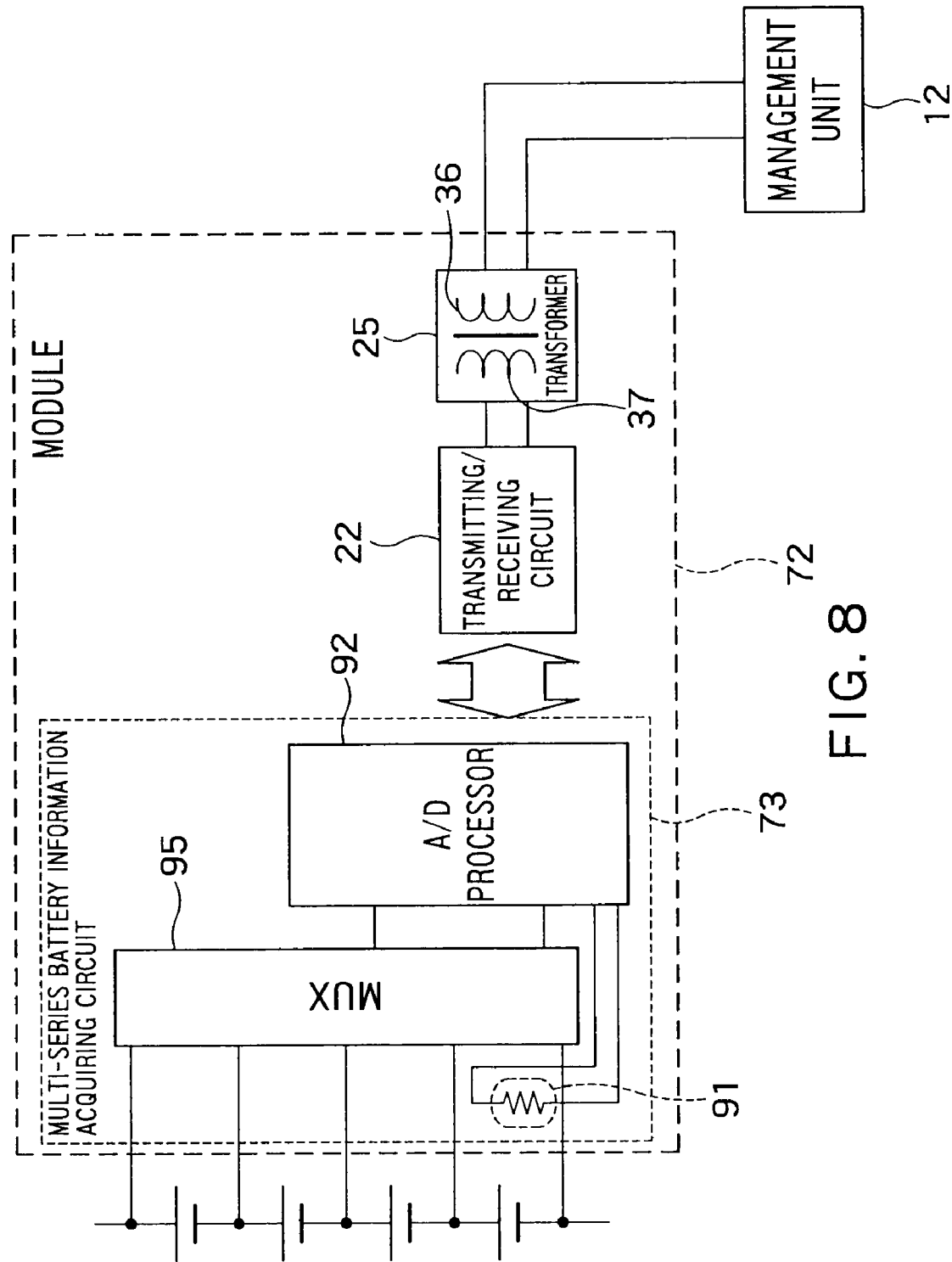
FIG. 8 shows a configuration example of the multi-series battery information acquiring circuit in the battery information acquiring module in FIG. 7.

FIG. 8 shows a detailed configuration example of the multi-series battery information acquiring circuit 73 in FIG. 7.

The multi-series battery information acquiring circuit 73 is provided with a temperature sensor 91, an A/D processor 92, and a selector (multiplexer) 95, and connected to M battery cells. Since the elements having the same names as those in FIG. 6 have basically equivalent functions, only the operation of the selector 95 which is not provided in FIG. 6 and extended operations of the elements having the same names as those in FIG. 6 will be explained below. The multi-series battery information acquiring circuit 73 and the transmitting/receiving circuit 22 are given a voltage between both ends of the M battery cells (the voltage between the plus terminal of the battery cell at the upper end in the figure and the minus terminal of the battery cell at the lower end in the figure out of the M battery cells) as the power supply voltage.

The selector 95 is connected to the M battery cells and detects the inter-terminal voltage of each battery cell. The selector 95 selects one of the M battery cells and outputs the voltage of the selected battery cell.

Furthermore, the temperature sensor 91 is provided in correspondence with any one of the M battery cells and detects the temperature of this battery cell as battery information. The detected temperature can be said to be a representative temperature of the M battery cells.

The voltage of the battery cell selected by the selector 95 and the voltage at the above-described detected temperature are inputted to the A/D processor 92 and converted to a digital signal. This digital signal is sent to the transmitting/receiving circuit 22 and the transmitting/receiving circuit 22 transmits this digital signal to the management unit 12 via the transformer 25.

Here, only one temperature sensor is arranged, but such a configuration may also be adopted that two or more temperature sensors and a second selector are arranged, the second selector selects one temperature sensor out of the temperature sensors and inputs the voltage of the selected temperature sensor to the A/D processor 92.

Figure 9:
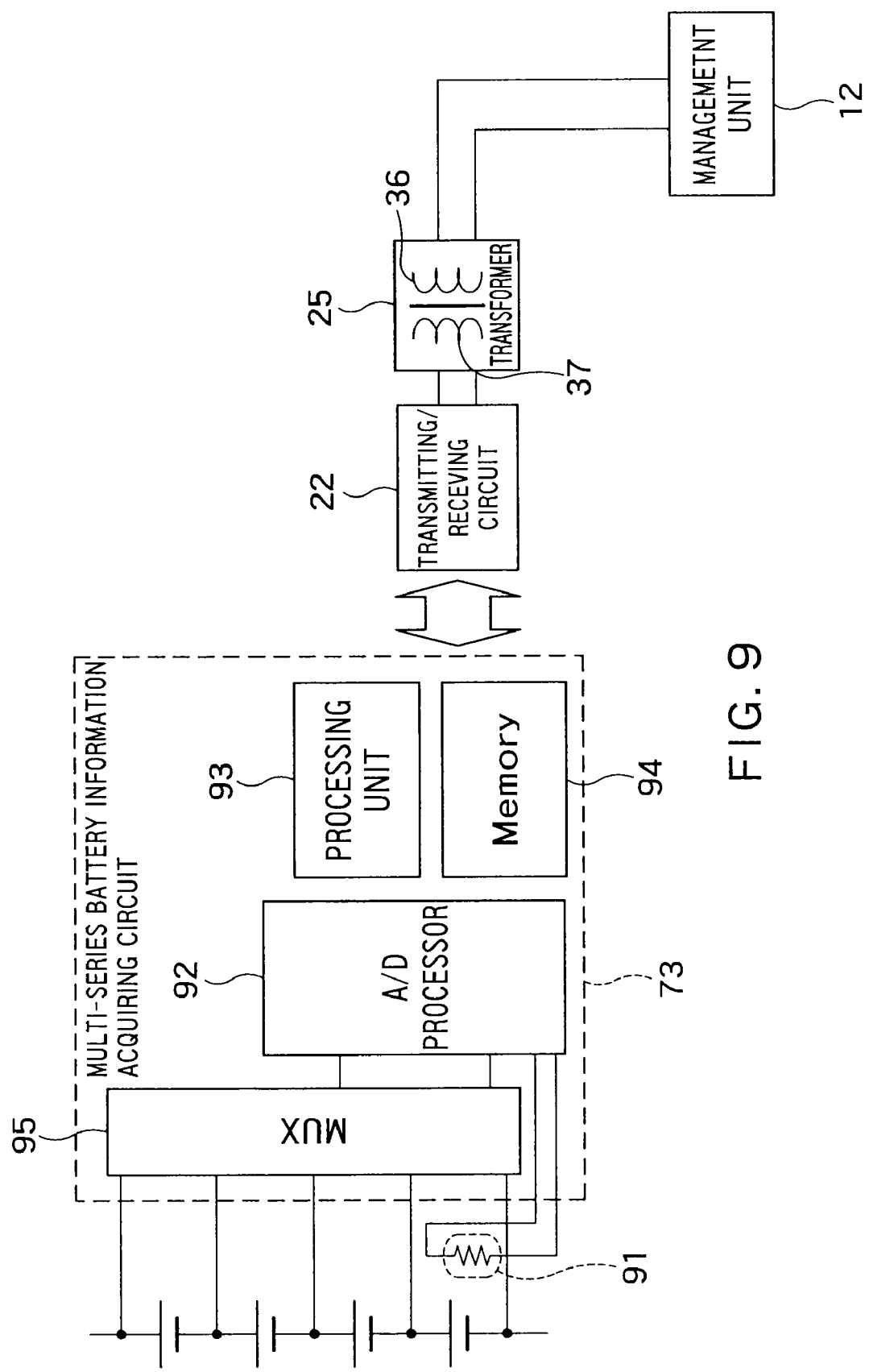
FIG. 9 shows another configuration example of the multi-series battery information acquiring circuit in the battery information acquiring module in FIG. 7.

Here, as shown in FIG. 9, the multi-series battery information acquiring circuit 73 may be further provided with a processing unit 93 and a memory 94.

The processing unit 93 controls the selector 95 so as to select a battery cell corresponding to a transmission command instruction from the management unit 12. The selector 95 selects one of the M battery cells according to an instruction from the processing unit 93 and outputs the voltage of the selected battery cell. The processing unit 93 receives the voltage of the selected battery cell via the A/D processor 92 as a digital signal, digitally processes this digital signal, converts the digital signal to a data format suitable for the management unit 12 and stores the digital signal in the memory 94. The processing unit 93 reads this data from the memory 94 and sends the data to the transmitting/receiving circuit 22. The transmission command from the management unit 12 may include, for example, an instruction for selecting M battery cells one by one or an instruction for selecting only specific battery cells out of the M battery cells one by one.

Furthermore, the processing unit 93 acquires the voltage of the temperature detected by the temperature sensor 91 according to a transmission command instruction from the management unit 12 via the A/D processor 92 as a digital signal, digitally processes the acquired digital signal, converts the digital signal to a data format suitable for the management unit 12 and stores the digital signal in the memory 94. The processing unit 93 reads this data from the memory 94 and sends the data to the transmitting/receiving circuit 22.

Figure 10:
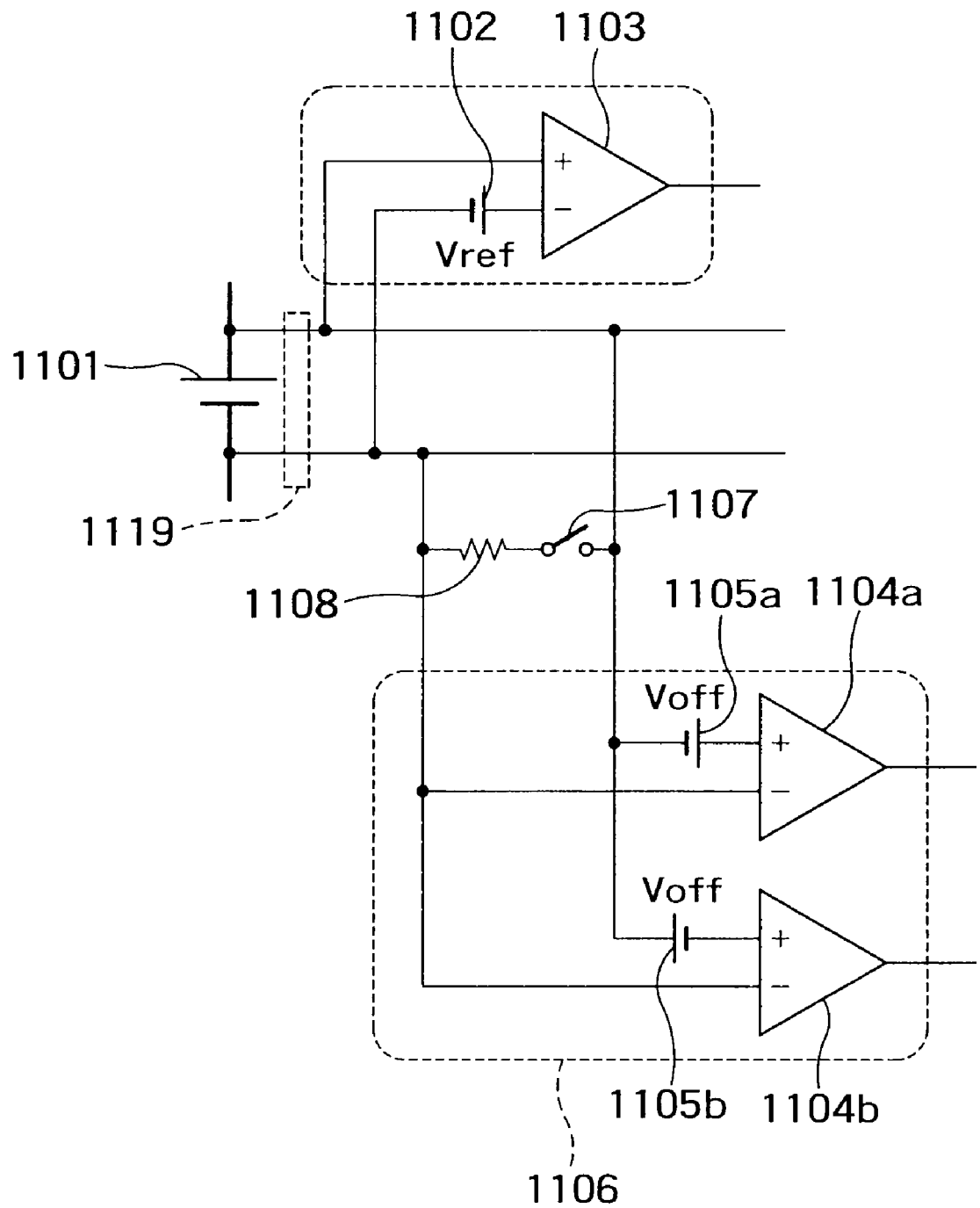
FIG. 10 shows a configuration example of the defect detection circuit.

FIG. 10 shows a configuration example of the defect detection circuit (voltage comparison circuit, wire breakage detection circuit, short-circuit detection circuit) 101 shown in FIG. 4. As described above, the defect detection circuit 101 has three major functions.

(1) A first function of the defect detection circuit 101 is the function of comparing an inter-terminal voltage of a battery cell 1101 with a predetermined voltage and detecting that the inter-terminal voltage falls below the predetermined voltage. The battery information acquiring circuit 21 operates on the voltage of the battery cell 1101, but when the voltage of the battery cell 1101 falls below a minimum operating voltage of the battery information acquiring circuit 21, the battery information acquiring circuit 21 can no longer operate and cannot correctly detect the battery information of the battery cell. Therefore, the defect detection circuit 101 checks whether the voltage of the battery cell 1101 has fallen below the minimum operating voltage of the battery information acquiring circuit 21 using a circuit having a minimum operating voltage lower than that of the battery information acquiring circuit 21 or using a circuit that operates using a voltage source other than the battery cell 1101 and transmits, when the voltage of the battery cell 1101 has fallen below the minimum operating voltage, a first defect signal indicating that the voltage of the battery cell 1101 has fallen below the minimum operating voltage of the battery information acquiring circuit to the management unit 12 via the transmitting/receiving circuit 22.

To compare the inter-terminal voltage of the battery cell 1101 with the predetermined voltage and detect that the inter-terminal voltage has fallen below the predetermined voltage, a voltage resulting from adding a predetermined voltage (Vref) 1102 to the minus terminal of the battery cell 1101 as shown in FIG. 10 may be compared with the voltage of the plus terminal of the battery cell 1101 by a comparator 1103. The comparator 1103 outputs a high level signal when the inter-terminal voltage is equal to or greater than the predetermined voltage and outputs a low level signal (first defect signal) when the voltage between the terminals is less than the predetermined voltage. The output signal from the comparator 1103 is transmitted to the management unit 12 via the transmitting/receiving circuit 22. The comparator 1103 corresponds to, for example, a voltage comparison circuit of the present invention and the predetermined voltage 1102 corresponds to, for example, a threshold voltage.

(2) A second function of the defect detection circuit 101 is the function of detecting that both terminals of the battery cell 1101 are short-circuited. As described above, the battery information acquiring circuit 21 operates on the voltage of the battery cell 1101, and therefore when both terminals of the battery cell 1101 are short-circuited and the potential difference becomes 0, the battery information acquiring circuit 21 can no longer operate and cannot correctly detect battery information of the battery cell. Therefore, the defect detection circuit 101 detects whether or not both terminals of the battery cell 1101 have short-circuited and when a short-circuit is detected, the defect detection circuit 101 transmits a second defect signal indicating the occurrence of a short-circuit of an inter-terminal of the battery cell 1101 to the management unit 12 via the transmitting/receiving circuit 22.

To detect a short-circuit of the inter-terminal of the battery cell 1101, the inter-terminal voltage of the battery cell 1101 may be compared by a comparator 1106 as shown in FIG. 10. To obtain stable operation, the present embodiment uses here an offset comparator as the comparator 1106, in which voltage sources (Voff) 1105a and 1105b having greater voltages than the offset voltages of comparators 1104a and 1104b are oppositely connected to the two comparators 1104a and 1104b respectively. The output signals of the comparators 1104a and 1104b are transmitted to the management unit 12 via the transmitting/receiving circuit 22. When no short-circuit has occurred, both the comparators 1104a and 1104b output high level signals (that is, a normal signal is outputted from the comparator 1106). When a short-circuit has occurred, a signal of other combinations (at least one output of the comparators 1104a and 1104b is a low level signal) is outputted as a second defect signal. The comparator 1106 corresponds to, for example, a short-circuit detection circuit of the present invention.

(3) A third function of the defect detection circuit 101 is the function of detecting that a connection wire 1109 connecting the battery cell 1101 and the battery information acquiring circuit 21 is broken. When breakage of wire occurs, the battery information acquiring circuit 21 will no longer operate and cannot correctly detect battery information of the battery cell 1101. Therefore, the defect detection circuit 101 detects whether or not breakage of wire has occurred and transmits, upon detecting breakage of wire, a third defect signal indicating the occurrence of breakage of wire to the management unit 12 via the transmitting/receiving circuit 22.

To detect that the connection wire 1109 connecting the battery cell 1101 and the battery information acquiring circuit 21 is broken, a switch 1107 and a resistor 1108 may be connected in series between the input terminals of the aforementioned comparator (offset comparator) 1106, ON/OFF of the switch 1107 may be periodically toggled and the output of the comparator 1106 when the switch is ON (that is, outputs of the comparators 1104a and 1104b) may be checked. When there is no breakage in the connection wire 1109 with the battery cell 1101, if the switch 1107 is turned ON, a certain voltage is generated in the resistor 1108 and high level signals are outputted from both the comparators 1104a and 1104b as in the case where no short-circuit has occurred (that is, a normal signal is outputted from the comparator 1106). On the other hand, if the wire with the battery cell 1101 is broken, the voltage generated at the resistor 1107 becomes 0, and as a result, a low level signal is outputted from at least one of the comparators 1104a and 1104b as in the case where a short-circuit has occurred between the comparators 1104a and 1104b. The combination of the output signals of the comparators 1104a and 1104b (output signal of the comparator 1106) in this case corresponds to a third defect signal. The combination of the resistor 1108, switch 1107 and comparator 1106 corresponds to a wire breakage detection circuit of the present invention.

When the switch 1107 is fixed to OFF, if breakage of wire occurs, a certain voltage occurs between the respective input terminals of the comparator 1106 due to the parasitic capacitance between the wires connected to both ends of the battery cell 1101, and therefore a normal signal is outputted from the comparator 1106 and it is not possible to detect the breakage of wire. However, when the switch 1107 is turned ON once after the breakage of wire, the charge of the parasitic capacitance is discharged, the voltage occurring at the resistor 1108 becomes 0 (that is, voltage between the wires becomes 0), and it is therefore possible to detect the breakage of wire.

Figure 11:
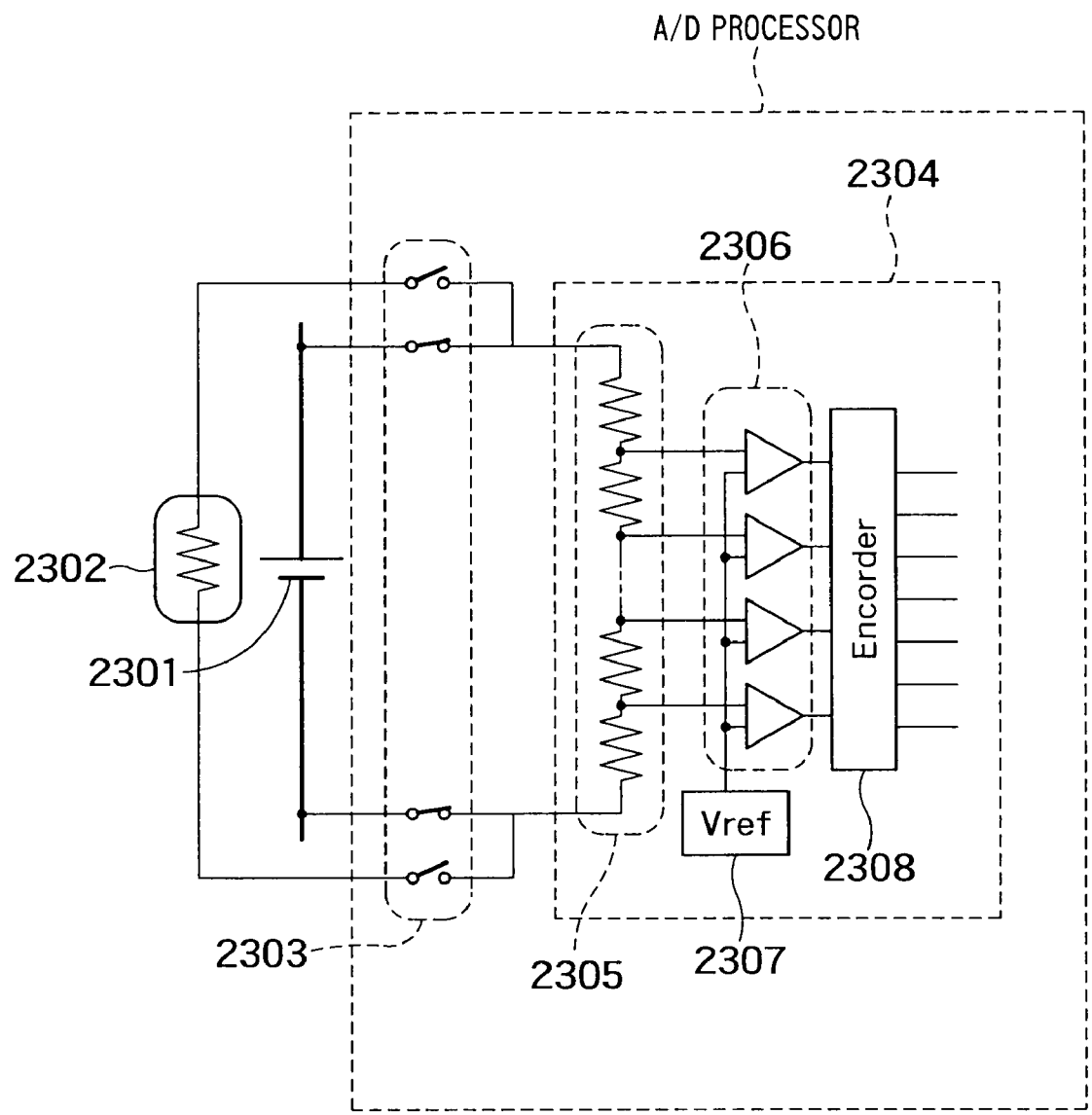
FIG. 11 shows a configuration example of the A/D processor.
Figure 12:
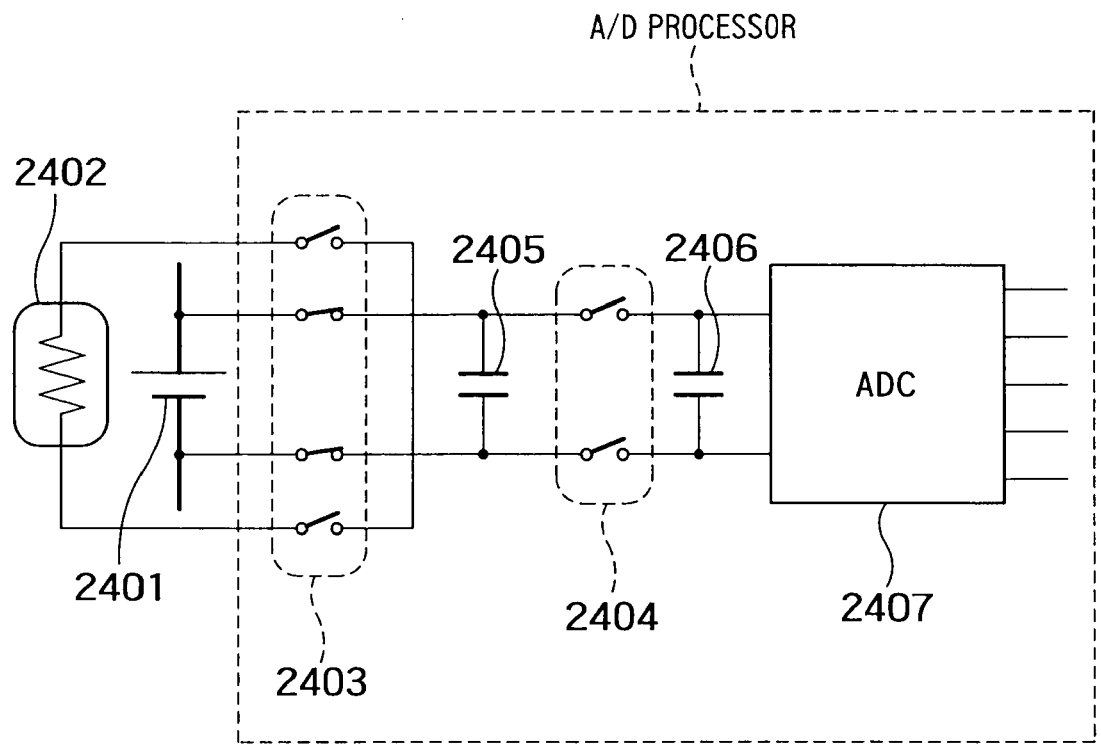
FIG. 12 shows another configuration example of the A/D processor.

FIG. 11 and FIG. 12 show detailed configuration examples of the A/D processor shown in FIG. 6 and FIG. 9.

Since the voltage of the battery cell is used as the power supply voltage of the A/D processor, the A/D processor needs to convert a voltage equal to the power supply voltage of the A/D processor itself from analog to digital. However, when the DC-DC converted voltage (assumed to be lower than the voltage of the battery cell here) is used as the power supply voltage of the A/D processor as shown in FIG. 3, a voltage greater than the DC-DC converted voltage needs to be converted from analog to digital. FIG. 11 shows a configuration example where the input voltage range and resolution are made variable and a voltage greater than the power supply voltage of the A/D processor itself is directly converted from analog to digital. FIG. 12 shows a configuration example where the input voltage is divided and the divided voltage is converted from analog to digital by a A/D converter (ADC) having a fixed input voltage range.

In FIG. 11, a battery cell 2301 and a temperature sensor 2302 are connected in parallel and one of the inter-terminal voltage of the battery cell 2301 and the detected voltage of the temperature sensor 2302 is selectively inputted to the A/D converter 2304 by switching the switch 2303. The inputted voltage is divided into $2^N$ voltages by serially connected $2^N+1$ resistors (resistor units) 2305 and inputted to $2^N$ comparators (comparison units) 2306. Here, "N" denotes the number of bits of an A/D converter 2304. A reference voltage (Vref) 2307 is inputted to the other input of each comparator 2306.

Each comparator 2306 compares the inputted divided voltage with the reference voltage (Vref) 2307 and outputs a signal indicating the magnitude relationship between the two. When, for example, the inputted divided voltage is greater than the reference voltage (Vref) 2307, a high level signal is outputted and when the inputted divided voltage is less than the reference voltage (Vref) 2307, a low level signal is outputted.

The output signal of each comparator 2306 is inputted to an encoder (voltage data generator) 2308 and the encoder 2308 outputs digital code (voltage data) indicating how many times the reference voltage the voltage inputted to the A/D processor is. That is, if the voltage of the battery cell 2301 is assumed to be greater than the reference voltage 2307, the output contents of each comparator 206 are switched on the boundary of comparator 26 where the divided voltage becomes smaller than the reference voltage 2307, and it is thereby possible to detect how many times the reference voltage 2307 the voltage of the battery cell 2301 is depending on the boundary position. The range of the input voltage is variable from the reference voltage to $2^N$ times the reference voltage.

When the voltage of the battery cell 2301 is substantially different from the voltage of the temperature sensor 2302, it is also possible to provide two types of reference voltage and change the reference voltage to be used in conjunction with the switch 2303.

In FIG. 12, a battery cell 2401 and a temperature sensor 2402 are connected in parallel and one of the inter-terminal voltage of the battery cell 2401 and the detected voltage of the temperature sensor 2402 is selected by switching of switches 2403. To reduce the selected voltage, switches 2404 are turned OFF first and the voltage is then charged into a capacitor 2405. After a predetermined time period necessary for charging, the switches 2403 are turned OFF and the switches 2404 are turned ON. The charge charged in the capacitor 2405 is redistributed between the capacitor 2405 and the capacitor 2406. The capacitors 2405, 2406 and switch 2404 correspond to a voltage dividing unit of the present invention.

Assuming the ratio between the capacitor 2405 and capacitor 2406 is 1:(N−1), the voltage of the capacitor 2406 corresponds to 1/N of the inter-terminal voltage of the battery cell 2401 or 1/N the detected voltage of the temperature sensor 2402. This voltage is converted by an A/D converter 2407 to a digital signal. When the detected voltage of the temperature sensor 2402 is smaller than an upper limit of the range of the input voltage of the A/D converter 2407, it is possible to turn ON the switches 2403 and the switches 2404 and directly input the detected voltage of the temperature sensor 2402 to the A/D converter 2407 without reducing the voltage.

Figure 13:
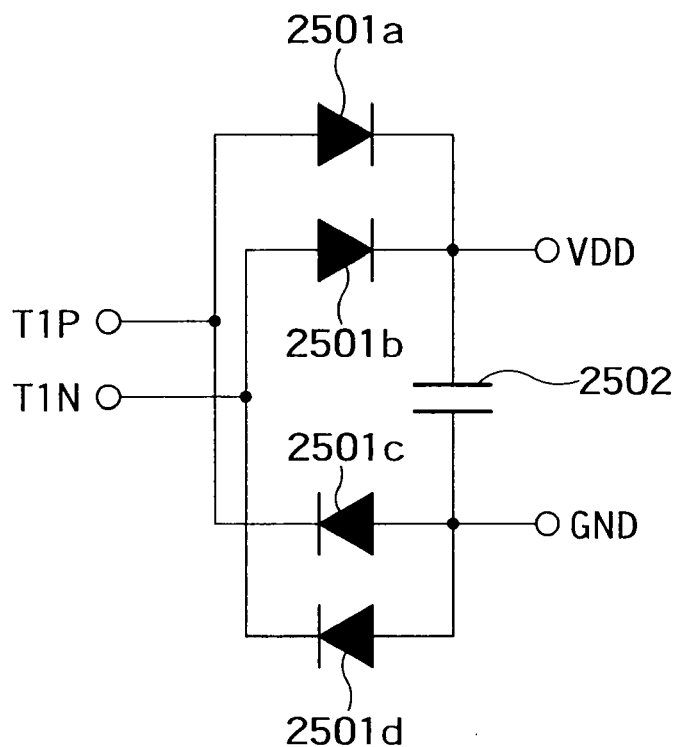
FIG. 13 shows a configuration example of the rectification circuit.

FIG. 13 shows a configuration example of the rectification circuit shown in FIG. 2 to FIG. 4.

This rectification circuit is a diode bridge made up of four diodes 2501a to 2501d and a capacitor 2502. A TIP terminal and a TIN terminal of the diode bridge are connected to the secondary winding of the transformer 25 (see FIG. 2). The AC signal transmitted from the management unit 12 is rectified by the diodes 2501a to 2501d and smoothed by the capacitor 2502. The smoothed DC voltage is supplied to the starting circuit 24 via the VDD terminal and GND terminal as the power supply voltage.

Here, as shown in FIG. 1, since the respective battery information acquiring modules are connected to a common wire in parallel with each other, at the time of transmission from a certain battery information acquiring module to the management unit 12, the transmission signal may be inputted to the rectification circuit in another battery information acquiring module and this may drive the rectification circuit.

This problem may be solved by changing the signal amplitude level at the time of reception and transmission of the battery information acquiring module respectively.

More specifically, at the time of reception of the battery information acquiring module, in order to drive the rectification circuits (diode bridges) in all the battery information acquiring module, the management unit 12 outputs a signal at such a signal amplitude level that all the diode bridges turn ON (that is, signal amplitude level equal to or greater than a threshold voltage of the diode (predetermined value)). On the other hand, at the time of transmission from the battery information acquiring module, a signal (battery information) whose maximum amplitude is at such a level that the rectification circuits of the other battery information acquiring module do not turn ON is transmitted to the management unit 12. This blocks the driving of the rectification circuits in the other battery information acquiring module at the time of transmission from the battery information acquiring module and can also block the driving of the rectification circuit 23 in the same module by a transmission signal from the transmitting/receiving circuit 22 in the battery information acquiring module. In this way, preventing the rectification circuits from being unnecessarily driven can achieve efficient use of power.

Figure 14:
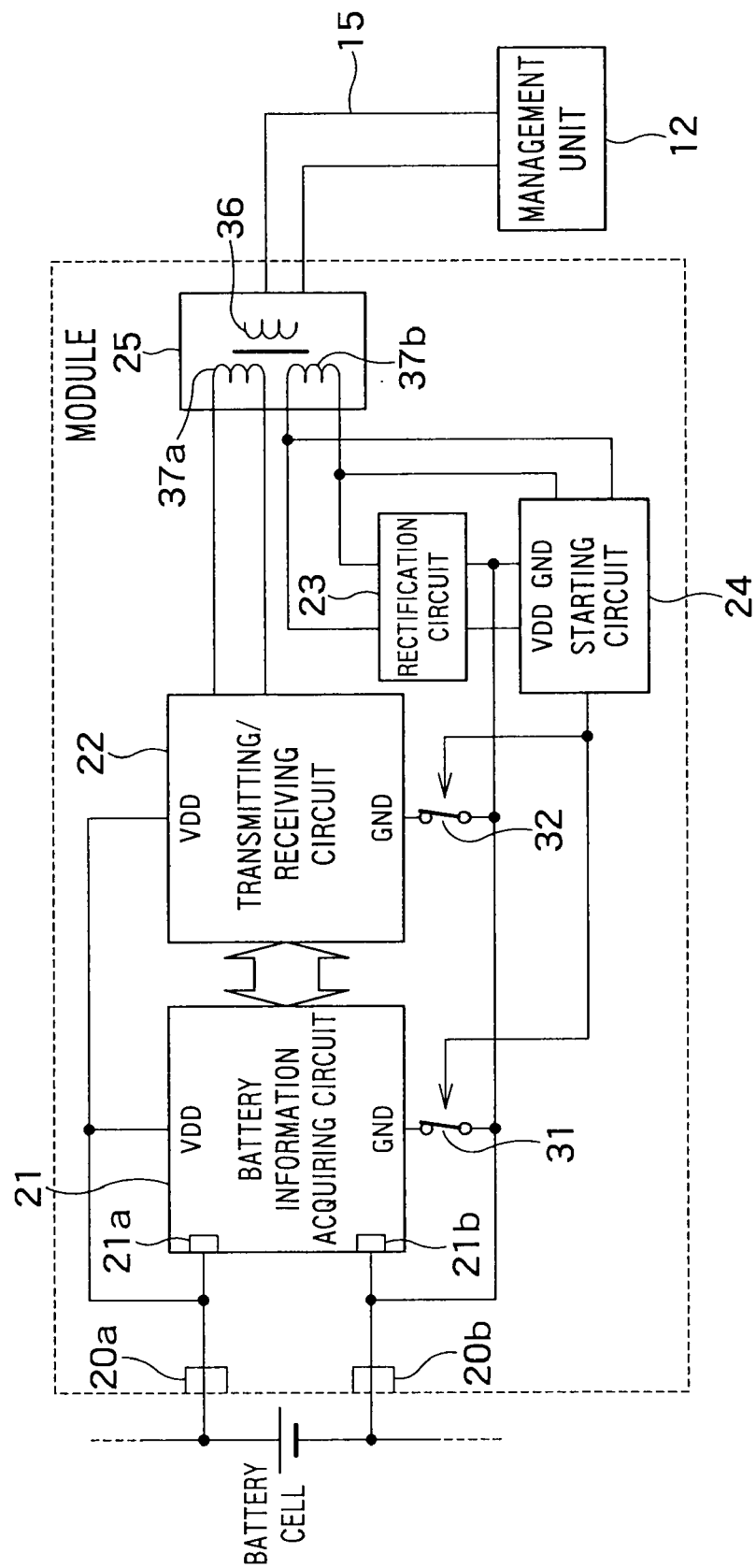
FIG. 14 shows an example where there are two secondary windings of the transformer in the battery information acquiring module.

A case has been explained so far assuming a transformer having one primary winding and one secondary winding (transformer with two primary side differential inputs and two secondary side differential outputs), but it is also possible to use a transformer having one primary winding and two secondary windings (transformer with two primary side differential inputs and four secondary side differential outputs). FIG. 14 shows a configuration example of a battery information management system using a transformer having one primary winding and two secondary windings (transformer with two inputs and four outputs). However, only one battery cell and the battery information acquiring module connected to the one battery cell is shown for simplicity of explanation here.

A transformer 25 has one primary winding 36 and two secondary windings 37a and 37b. The secondary winding (one of the secondary windings) 37a is connected to the transmitting/receiving circuit 22 and the secondary winding (the other of the secondary windings) 37b is connected to the rectification circuit 23 and the starting circuit 24. In this case, since power is transmitted to the rectification circuit 23 to drive the starting circuit 24, the coupling coefficient between the secondary winding 37b and primary winding 36 is set to a relatively large value and since a signal is transmitted to the transmitting/receiving circuit 22, the coupling coefficient between the secondary winding 37a and the primary winding 36 can also be set to a relatively small value. In the example of FIG. 14, the starting circuit 24 is connected to the secondary winding 37b, but the starting circuit 24 may also be connected to the secondary winding 37a.

The present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

What is claimed is:

1. A battery information acquiring apparatus that acquires battery information of a battery cell in a battery pack including a plurality of battery cells connected in series and transmits the battery information to a management unit that manages a state of the battery pack, comprising:
- a voltage acquiring unit configured to acquire an inter-terminal voltage of the battery cell;
- a battery information acquiring circuit configured to acquire battery information of the battery cell, the battery information acquiring unit being supplied with the voltage acquired by the voltage acquiring unit as a first power supply voltage and;
- a transformer configured to have a primary winding and a secondary winding, the primary winding being connected to a common wire to which the management unit and other battery information acquiring apparatuses that acquire battery information of different battery cells out of the battery cells are commonly connected;
- a communication circuit connected to the secondary winding of the transformer, which transmits a signal of the battery information to the management unit via the transformer and the common wire, the communication circuit being supplied with the voltage acquired by the voltage acquiring unit as a second power supply voltage;
- a rectification circuit connected to the secondary winding of the transformer, which receives a signal of a predetermined frequency transmitted from the management unit via the transformer, and rectifies the signal of the predetermined frequency to generate a DC voltage; and
- a control circuit connected to the secondary winding of the transformer, which controls the supply of the first and second power supply voltages to the battery information acquiring circuit and the communication circuit, the control circuit being supplied with the DC voltage generated by the rectification circuit as a third power supply voltage,
- wherein the control circuit comprises:
- a first receiving unit configured to receive a first command signal indicating whether or not to supply the first power supply voltage to the battery information acquiring circuit from the management unit via the common wire and the transformer;
- a second receiving unit configured to receive a second command signal indicating whether or not to supply the second power supply voltage to the communication circuit from the management unit via the common wire and the transformer;
- a first controller configured to control supply of the first power supply voltage to the battery information acquiring circuit according to the first command signal; and
- a second controller configured to control supply of the second power supply voltage to the communication circuit according to the second command signal.

2. The apparatus according to claim 1, further comprising a power supply circuit configured to DC-DC convert the inter-terminal voltage of the battery cell acquired by the voltage acquiring unit,
- wherein the voltage resulting from DC-DC converting the inter-terminal voltage is supplied to the battery information acquiring circuit and the communication circuit as the first and second power supply voltages from the power supply circuit.

3. The apparatus according to claim 1, wherein the battery information acquiring unit acquires at least one of the inter-terminal voltage of the battery cell and a temperature of the battery cell as the battery information.

4. The apparatus according to claim 3, wherein the battery information acquiring unit comprises a voltage input unit configured to input the inter-terminal voltage of the battery cell, a temperature sensor configured to detect the temperature of the battery cell and an A/D processor, and
- the A/D processor acquires the inter-terminal voltage of the battery cell inputted from the voltage input unit as a first voltage, acquires a second voltage representing the temperature of the battery cell via the temperature sensor, converts the first and second voltages to digital signals respectively and sends the digital signals to the communication circuit.

5. The apparatus according to claim 1, wherein the battery information acquiring unit acquires respective inter-terminal voltages of M (M is an integer equal to 2 or greater) serially connected battery cells out of the battery cells and a temperature of at least one of the M battery cells as the battery information, and
- a voltage between both ends of the M serially connected battery cells is supplied to the battery information acquiring circuit and the communication circuit as the first and second power supply voltages.

6. The apparatus according to claim 5, wherein the battery information acquiring unit comprises a plurality of voltage input units configured to input respective inter-terminal voltage of the M battery cells, a selector configured to select one of the voltage input units, a temperature sensor configured to detect a temperature of at least one of the battery cells and an A/D processor, and
- the A/D processor acquires the inter-terminal voltage of the battery cell inputted from the voltage input unit selected by the selector as a first voltage, acquires a second voltage representing a temperature of the battery cell via the temperature sensor, converts the first and second voltages to digital signals respectively and sends the digital signals to the communication circuit.

7. The apparatus according to claim 4, wherein the A/D processor comprises:
- a plurality of serially connected resistor units configured to divide the first or second voltage;
- a comparison unit configured to compare a voltage at one end of each of the resistor units with a reference voltage and generate a comparison signal representing a magnitude relationship between the reference voltage and the voltage at the one end of each of the resistor units, respectively; and
- a voltage data generator configured to generate voltage data representing the first or the second voltage based on each generated comparison signal and send out the voltage data generated to the communication circuit.

8. The apparatus according to claim 4, wherein the A/D processor comprises:
- a voltage dividing unit configured to divide the first or second voltage by a plurality of capacitors connected in parallel; and
- an A/D converter configured to convert a voltage applied to one of the capacitors from analog to digital and send out the converted voltage to the communication circuit.

9. The apparatus according to claim 1, wherein the communication circuit has unique ID information, and
- the communication circuit transmits a signal including both of the ID information and the battery information to the management unit.

10. The apparatus according to claim 1, further comprising a voltage comparison circuit configured to compare the inter-terminal voltage of the battery cell with a threshold voltage,
- wherein when the inter-terminal voltage of the battery cell falls below the threshold voltage, the voltage comparison circuit sends a first defect signal to the communication circuit, and the communication circuit transmits the first defect signal to the management unit via the transformer and the common wire.

11. The apparatus according to claim 1, further comprising a wire breakage detection circuit configured to detect breakage of a connection wire placed between the battery cell and the battery information acquiring circuit,
   wherein the wire breakage detection circuit sends a second defect signal to the communication circuit upon detecting the breakage of the connection wire, and
   the communication circuit transmits the second defect signal to the management unit via the transformer and the common wire.

12. The apparatus according to claim 1, further comprising a short-circuit detection circuit configured to detect a short-circuit of the inter-terminal of the battery cell,
   wherein the short-circuit detection circuit sends a third defect signal to the communication circuit upon detecting the short-circuit of the inter-terminal of the battery cell, and
   the communication circuit transmits the third defect signal to the management unit via the transformer and the common wire.

13. The apparatus according to claim 10, wherein the communication circuit comprises a second voltage acquiring unit configured to acquire the DC voltage generated by the rectification circuit, and
   the communication circuit operates, when the supply of the second voltage from the voltage acquiring unit is stopped, using the DC voltage as a fourth power supply voltage.

14. The apparatus according to claim 1, wherein the rectification circuit performs rectification when the signal of an amplitude level equal to or greater than a predetermined value is inputted and does not perform rectification when the signal of an amplitude level lower than the predetermined value is inputted,
   the communication circuit transmits the signal of the battery information at an amplitude level lower than the predetermined value to the management unit, and
   the management unit transmits the signal of the predetermined frequency, the first command signal and the second command signal at an amplitude level greater than the predetermined value.

15. The apparatus according to claim 14, wherein the rectification circuit comprises a diode bridge having a plurality of diodes, and
   the predetermined value represents a threshold voltage of the diodes.

16. The apparatus according to claim 1, wherein the transformer comprises two secondary windings,
   the communication circuit is connected to one of the two secondary windings, the rectification circuit is connected to the other of the two secondary windings and the control circuit is connected to one or the other of the two secondary windings, and
   a coupling coefficient between the other secondary winding and the primary winding is greater than the coupling coefficient between the one secondary winding and the primary winding.

* * * * *